United States Patent
Lin

(10) Patent No.: US 11,004,421 B2
(45) Date of Patent: May 11, 2021

(54) OPERATIONAL AMPLIFIER CIRCUIT AND DISPLAY APPARATUS WITH OPERATIONAL AMPLIFIER CIRCUIT FOR AVOIDING VOLTAGE OVERSHOOT

(71) Applicant: Fitipower Integrated Technology, Inc., Hsinchu (TW)

(72) Inventor: Kun-Tsung Lin, Hsinchu (TW)

(73) Assignee: Fitipower Integrated Technology, Inc., Hsinchu (TW)

( * ) Notice: Subject to any disclaimer, the term of this patent is extended or adjusted under 35 U.S.C. 154(b) by 43 days.

(21) Appl. No.: 16/694,404

(22) Filed: Nov. 25, 2019

(65) Prior Publication Data

US 2021/0090520 A1    Mar. 25, 2021

(30) Foreign Application Priority Data

Sep. 23, 2019 (CN) .......................... 201910897266.3

(51) Int. Cl.
| | |
|---|---|
| *G06F 3/038* | (2013.01) |
| *G09G 5/00* | (2006.01) |
| *H03F 3/68* | (2006.01) |
| *H03F 3/45* | (2006.01) |
| *H03F 1/30* | (2006.01) |

(52) U.S. Cl.
CPC ............ *G09G 5/003* (2013.01); *H03F 1/301* (2013.01); *H03F 3/45179* (2013.01); *H03F 3/68* (2013.01); *G09G 2310/0291* (2013.01); *H03F 2203/45322* (2013.01); *H03F 2203/45344* (2013.01); *H03F 2203/45352* (2013.01); *H03F 2203/45356* (2013.01); *H03F 2203/45358* (2013.01)

(58) Field of Classification Search
CPC .... G09G 5/003; H03G 1/301; H03G 3/45179; H03G 3/68
USPC ......................................................... 345/212
See application file for complete search history.

(56) References Cited

U.S. PATENT DOCUMENTS

| | | | |
|---|---|---|---|
| 2008/0111626 A1* | 5/2008 | Lin ........................ | H03F 3/3022 330/255 |
| 2013/0194039 A1* | 8/2013 | Hirose ................... | H03F 3/3028 330/253 |
| 2016/0211808 A1* | 7/2016 | Lee ........................ | H03F 3/4565 |

* cited by examiner

*Primary Examiner* — Jonathan M Blancha
(74) *Attorney, Agent, or Firm* — ScienBiziP, P.C.

(57) ABSTRACT

An operational amplifier circuit in a display apparatus which is fast-acting to prevent voltage overshoot comprises a pre-operational amplifier module, an output operational amplifier module, and an output module. Driving current from the pre-operational amplifier module is the basis of the output operational amplifier module generating a dynamic bias voltage to the output module. The output operational amplifier module detects the dynamic bias voltage and adjusts the bias voltage to be level with a specified voltage based on at least one control voltage. When the dynamic bias voltage is less than the specified voltage, the output operational amplifier module pulls up the bias voltage and when the bias voltage is larger than the specified voltage, the output operational amplifier module pulls down the bias voltage. The pull up and pull down speeds are proportional to the at least one control voltage.

18 Claims, 3 Drawing Sheets

//  OPERATIONAL AMPLIFIER CIRCUIT AND DISPLAY APPARATUS WITH OPERATIONAL AMPLIFIER CIRCUIT FOR AVOIDING VOLTAGE OVERSHOOT

FIELD

The subject matter herein generally relates to display apparatus with operational amplifier circuit for avoiding voltage overshoot.

BACKGROUND

An electronic device able to display pictures can comprise a plurality of scan lines parallel with each other and a plurality of data lines parallel with each other. The scan lines are intersected with the data lines, and pixel units are defined at cross points of the scan lines and the data lines. A gate driver provides scan signals to the scan lines, and a data driver provides data signals to the data lines. The data driver includes an output operational amplifier circuit for charging or discharging a load end. If inner currents of the operational amplifier cannot recover immediately, a rapid charging or discharging operation will generate a voltage overshoot.

There is room for improvement in the art.

BRIEF DESCRIPTION OF THE FIGURES

Implementations of the present disclosure will be described, by way of embodiment, with reference to the figures.

DETAILED DESCRIPTION

Figure 1:
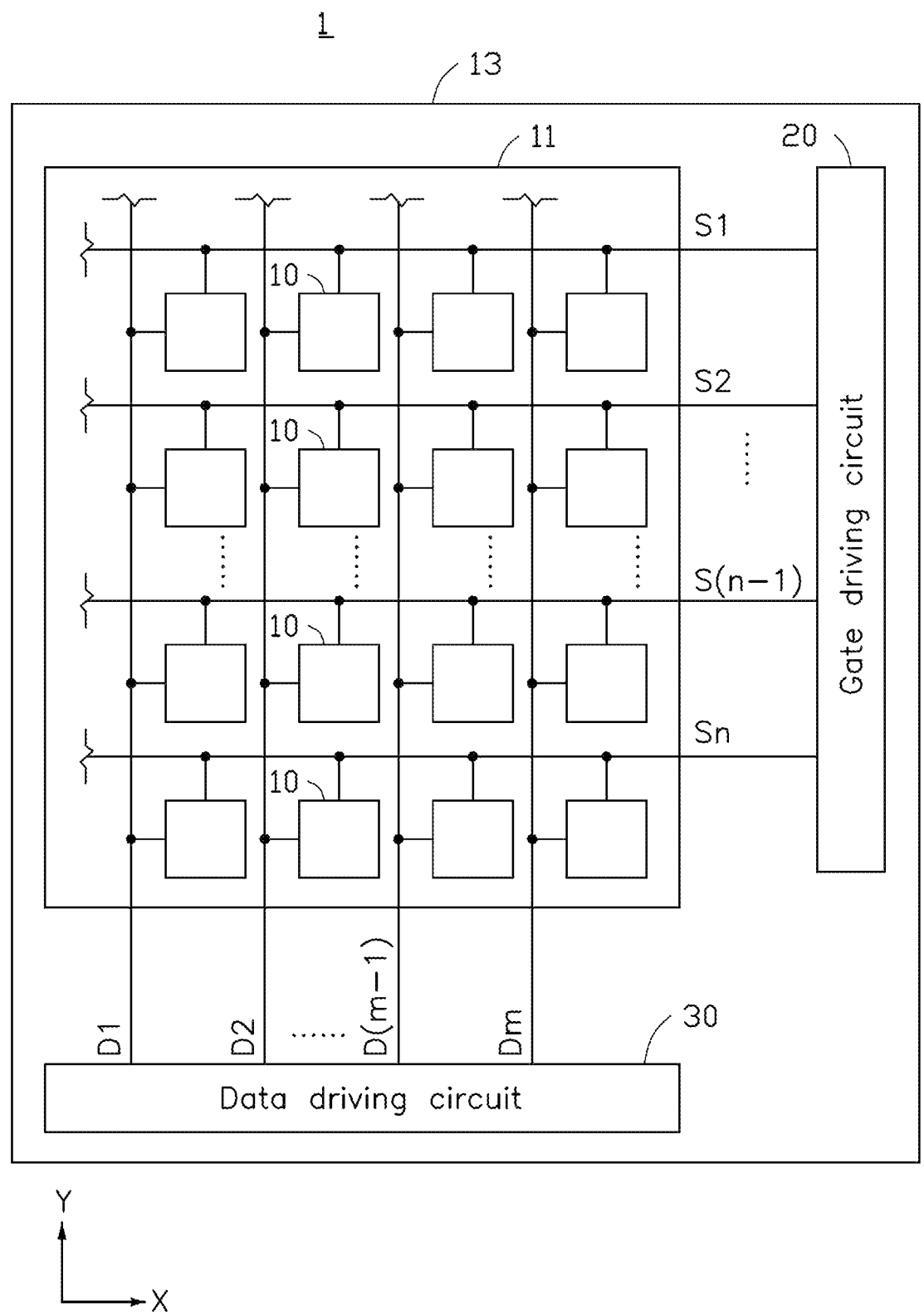
FIG. 1 is a diagram showing an embodiment of a display apparatus, the display apparatus comprising an operational amplifier circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape, or other feature that the term modifies, such that the component need not be exact. For example, "substantially cylindrical" means that the object resembles a cylinder but can have one or more deviations from a true cylinder. In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one." Embodiments of the present disclosure are described with reference to the drawings.

The present disclosure describes a display apparatus for avoiding voltage overshoot.

FIG. 1 shows a display apparatus 1. The display apparatus 1 defines a display region 11 and a non-display region 13 surrounding the display region 11. The display region 11 includes a plurality of scan lines S1-Sn and a plurality of data lines D1-Dm. The scan lines S1-Sn extend along a first direction X and the data lines D1-Dm extend along a second direction Y, direction Y being perpendicular to the first direction X, in a grid formation. Pixel units 10 are defined at the intersections. In other exemplary embodiments, the scan lines S1-Sn and the data lines D1-Dm can be obliquely angled, but not limited to such embodiments. The display apparatus 1 further includes a gate driving circuit 20 and a data driving circuit 30, which are located in the non-display region 13. Each pixel unit 10 is electrically connected to the gate driving circuit 20 through one of the scan lines S1-Sn and is electrically connected to the data driving circuit 30 through one of the data lines D1-Dm. In one embodiment, the gate driving circuit 20 and the data driving circuit 30 are formed on a chip-on-glass (COG) in a tape-automated bonding (TAB) manner or formed on a display panel in a gate-in-panel (GIP) manner. In other embodiments, the gate driving circuit 20 and the data driving circuit 30 are embedded in the display panel. The display apparatus 1 further includes a time controller (not shown) in the non-display region 13. The time controller supplies control signals (not shown) to the gate driving circuit 20 for driving the display apparatus to display images, and further supplies data signals to the data driving circuit 30. The control signals may include a vertical synchronization (Vsync) signal, a horizontal synchronization (Hsync) signal, a clock (CLK) signal, and a data enable (DE) signal, not being limited thereto.

Figure 2:
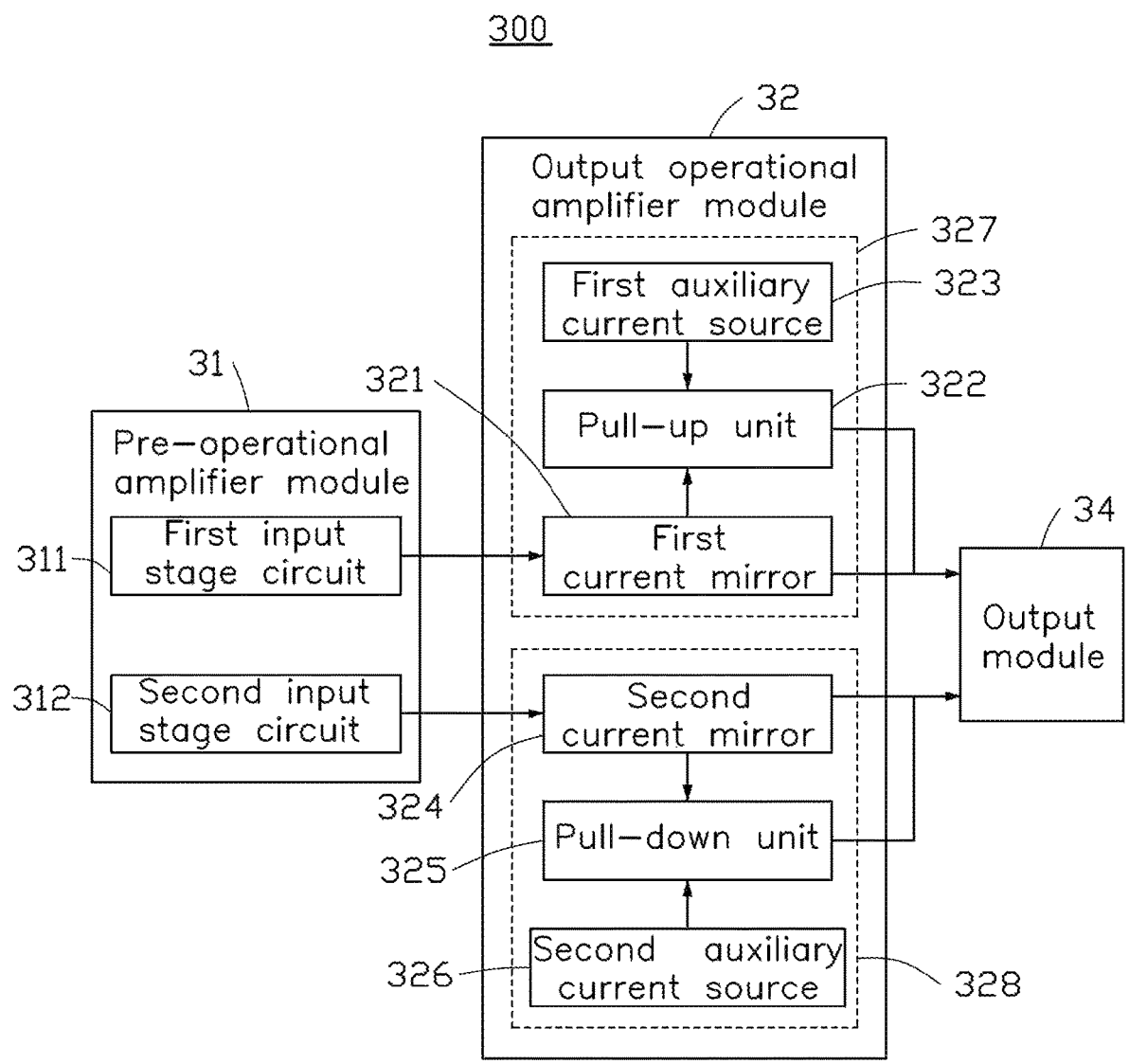
FIG. 2 is a diagram showing the operational amplifier circuit of FIG. 1.
Figure 3:
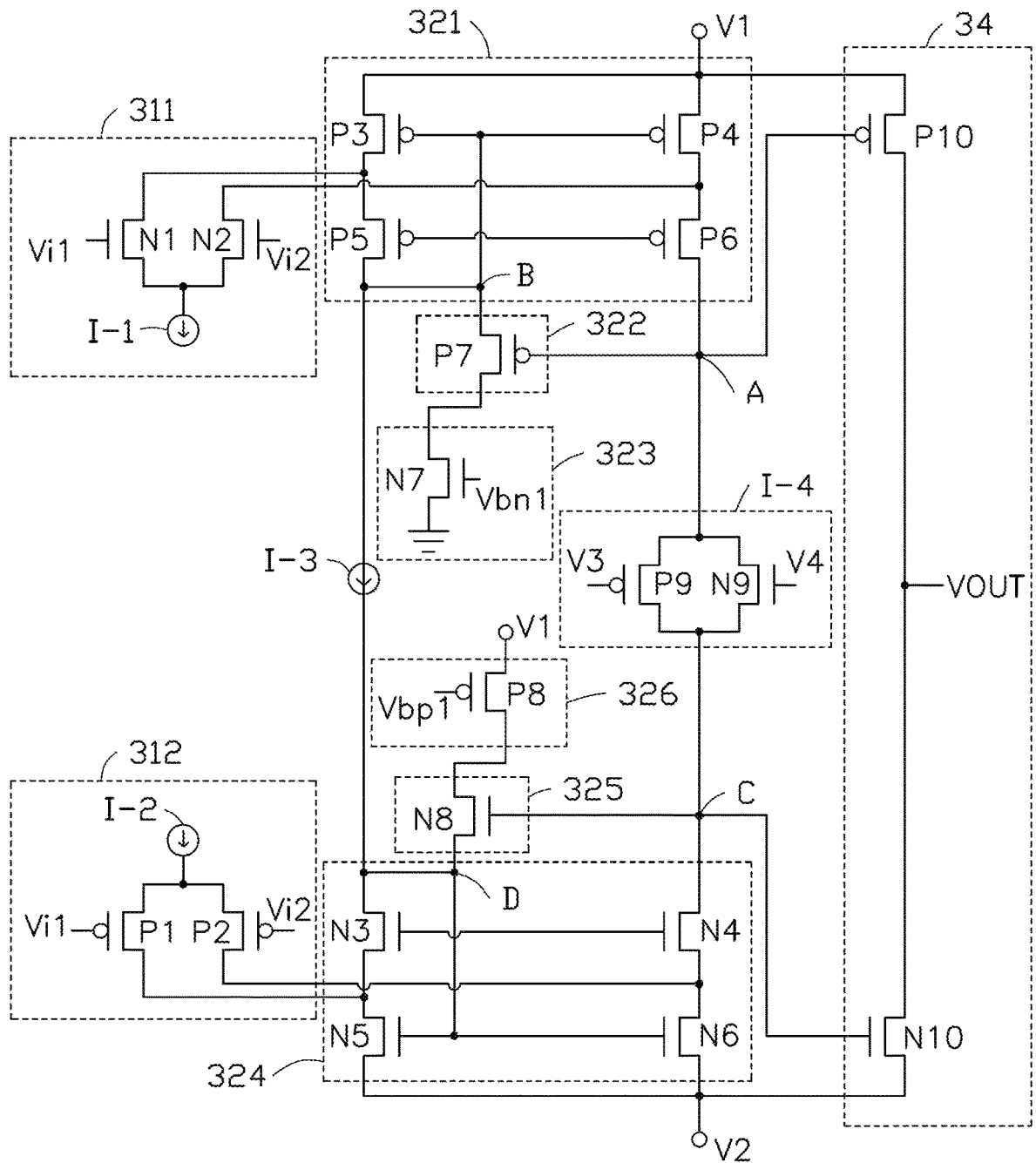
FIG. 3 is a circuit diagram of the operational amplifier circuit of FIG. 2.

FIGS. 2 and 3 show the data driving circuit with an operational amplifier circuit 300. The operational amplifier circuit 300 includes a pre-operational amplifier module 31, an output operational amplifier module 32, and an output module 34.

The pre-operational amplifier module 31 outputs driving current to the output operational amplifier module 32 based on an input voltage. The pre-operational amplifier module 31 includes a first input terminal Vi1 and a second input terminal Vi2. The first input terminal Vi1 receives a first input voltage. The second input terminal Vi2 receives a second input voltage. The pre-operational amplifier module 31 is a rail-to-rail operational amplifier circuit. The pre-operational amplifier module 31 includes a first current source I-1, a second current source I-2, a first transistor N1, a second transistor N2, a third transistor P1, and a fourth transistor P2. The first current source I-1, the first transistor N1, and the second transistor N2 form a first input stage circuit 311. The first stage circuit 311 is an N-channel input stage circuit. The second current source i-2, the third transistor P1, and the fourth transistor P2 form a second input stage circuit 312. The second stage circuit 312 is a P-channel input stage circuit. A gate electrode of the first transistor N1 is electrically connected to the first input terminal Vi1. A source electrode of the first transistor N1 is electrically connected to the first current source I-1. A drain electrode of the first transistor N1 is electrically connected to the output operational amplifier module 32. A gate electrode of the second transistor N2 is electrically connected to the second input terminal Vi2. A source electrode of the second transistor N2 is electrically connected to the first current source I-1. A drain electrode of the second transistor N2 is electrically connected to the output operational amplifier module 32. A gate electrode of the third transistor P1 is electrically connected to the first input terminal Vi1. A source electrode of the third transistor P1 is electrically connected to the second current source i-2. A drain electrode of the third transistor P1 is electrically connected to the output operational amplifier module 32. A gate electrode of the fourth transistor P2 is electrically connected to the second input terminal Vi2. A source electrode of the fourth transistor P2 is electrically connected to the second current source i-2. A drain electrode of the fourth transistor P2 is electrically connected to the output operational amplifier module 32. In one embodiment, the first transistor N1 and the second transistor N2 are N-type MOS transistors, and the third transistor P1 and the second transistor P2 are P-type MOS transistors. The first terminal Vi1 receives the first input voltage, and the second terminal Vi2 receives the second input voltage. In other embodiments, when the pre-operational amplifier module 31 is used as a differential operational amplifier, the second terminal Vi2 receives the first input voltage, and the first terminal Vi1 receives the output voltage of the output module 34.

The output operational amplifier module 32 is electrically connected to the pre-operational amplifier module 31. The output operational amplifier module 32 outputs a dynamic bias voltage to the output module 34 based on the driving current generated by the pre-operational amplifier module 31. The output operational amplifier module 32 is electrically connected to a first voltage source V1, a second voltage source V2, a third voltage source V3, and a fourth voltage source V4. The output operational amplifier module 32 further receives a first control voltage Vbn1 and a second control voltage Vbp1. In one embodiment, the voltage of the first voltage source V1 is larger than the voltage of the second voltage source V2, and the voltage of the third voltage source V3 and the voltage of the fourth voltage source V4 are less than the voltage of the first voltage source V1, and are more than the voltage of the second voltage source V2. The output operational amplifier module 32 further detects the dynamic bias voltage. When the dynamic bias voltage is less than a specified voltage, the output operational amplifier module 32 pulls up the dynamic bias voltage based on the first control voltage Vbn1. When the dynamic bias voltage is larger than the specified voltage, the output operational amplifier module 32 pulls down the dynamic bias voltage based on the second control voltage Vbp1. In one embodiment, the specified voltage is a sum of threshold voltages of at least two transistors in the output operational amplifier module 32.

The output operational amplifier module 32 includes a third current source i-3, a fourth current source i-4, a first current mirror 321, a pull-up unit 322, a first auxiliary current source 323, a second current mirror 324, a pull-down unit 325, and a second auxiliary current source 326. The first current mirror 321, the pull-up unit 322, and the first auxiliary current source 323 form a first amplifier stage circuit 327. The first amplifier circuit 327 is coupled to the first input stage circuit 311. The second current mirror 324, the pull-down unit 325, and the second auxiliary current source 326 form a second amplifier stage circuit 328. The second amplifier stage circuit 328 is coupled to the second input stage circuit 312.

The first current mirror 321 outputs the dynamic bias voltage to the output module 34 based on the driving current. The pull-up unit 322 detects whether the dynamic bias voltage is less than the specified voltage. When the dynamic bias voltage is less than the specified voltage, the pull-up unit 322 provides a current of the first auxiliary current source 323 based on the first control voltage Vbn1 to the output module 34, for pulling up the dynamic bias voltage. The current of the first auxiliary current source 323 is proportional to a pulling up speed. The larger the current of the first auxiliary current source 323, the faster the pulling up speed of the dynamic bias voltage becomes. The less the current of the first auxiliary current source 323, the slower the pulling up speed of the dynamic bias voltage becomes. When the dynamic bias voltage is larger than or equal to the specified voltage, the pull-up unit 322 disconnects the first auxiliary current source 323 from the output module 34, thus the dynamic bias voltage of the first current mirror 321 is directly provided to the output module 34.

The second current mirror 324 outputs the dynamic bias voltage to the output module 34 based on the driving current. The pull-down unit 325 detects whether the dynamic bias voltage is larger than the specified voltage. When the dynamic bias voltage is larger than the specified voltage, the pull-up unit 325 provides a current of the second auxiliary current source 326 based on the second control voltage Vbp1 to the output module 34, for pulling down the dynamic bias voltage. The current of the second auxiliary current source 326 is proportional to a pulling down speed. The larger the current of the second auxiliary current source 326, the faster the pulling down speed of the dynamic bias voltage becomes. The less the current of the second auxiliary current source 326, the slower the pulling down speed of the dynamic bias voltage becomes. When the dynamic bias voltage is less than or equal to the specified voltage, the pull-down unit 325 disconnects the second auxiliary current source 326 from the output module 34, thus the dynamic bias voltage of the second current mirror 324 is directly provided to the output module 34.

The first current mirror 321 includes a fifth transistor P3, a sixth transistor P4, a seventh transistor P5, and an eighth transistor P6. A gate electrode of the fifth transistor P3 is electrically connected to the pull-up unit 322. A source electrode of the fifth transistor P3 is electrically connected to the first voltage source V1. A drain electrode of the fifth transistor P3 is electrically connected to the drain electrode of the first transistor N1. A gate electrode of the sixth transistor P4 is electrically connected to the pull-up unit 322. A source electrode of the sixth transistor P4 is electrically connected to the first voltage source V1. A drain electrode of the sixth transistor P4 is electrically connected to the drain electrode of the second transistor N2. A gate electrode of the seventh transistor P5 is electrically connected to a gate electrode of the eighth transistor P6. A source electrode of the seventh transistor P5 is electrically connected to the drain electrode of the fifth transistor P3. A drain electrode of the fifth transistor P5 is electrically connected to the pull-up unit 322. A source electrode of the eighth transistor P6 is electrically connected to the drain electrode of the sixth transistor P4. A drain electrode of the eighth transistor P6 is electrically connected to the pull-up unit 322. In one embodiment, the fifth transistor P3, the sixth transistor P4, the seventh transistor P5, and the eighth transistor P6 are PMOS transistors.

The pull-up unit 322 includes a ninth transistor P7. A gate electrode of the ninth transistor P7 is electrically connected to the output module 34 through a first node A, and is electrically connected to the drain electrode of the eighth transistor P6. A drain electrode of the ninth transistor P7 is electrically connected to the first auxiliary current source 323. A source electrode of the ninth transistor P7 is electrically connected to the gate electrode of the fifth transistor P3 and the gate electrode of the sixth transistor P4 through the second node B. In one embodiment, the ninth transistor P7 is a PMOS transistor.

The first auxiliary current source 323 includes a tenth transistor N7. A gate electrode of the tenth transistor N7 receives the first control voltage Vbn1. A drain electrode of the tenth transistor N7 is electrically connected to the drain electrode of the ninth transistor P7. A source electrode of the tenth transistor N7 is grounded. In one embodiment, the tenth transistor N7 is an NMOS transistor.

The second current mirror 324 includes an eleventh transistor N3, a twelfth transistor N4, a thirteenth transistor N5, and a fourteenth transistor N6. A gate electrode of the eleventh transistor N3 is electrically with a gate electrode of the twelfth transistor N4. A drain electrode of the eleventh transistor N3 is electrically connected to the third current source i-3. A source electrode of the eleventh transistor N3 is electrically connected to the drain electrode of the first transistor P1. A drain electrode of the twelfth transistor N4 is electrically connected to the fourth current source i-4. A source electrode of the twelfth transistor N4 is electrically connected to the drain electrode of the fourth transistor P2. A gate electrode of the thirteenth transistor N5 is electrically connected to the pull-down unit 325. A drain electrode of the thirteenth transistor N5 is electrically connected to the source electrode of the seventh transistor N3. A source electrode of the thirteenth transistor N5 is electrically connected to the second voltage source V2. A gate electrode of the fourteenth transistor N6 is electrically connected to the pull-down unit 325 and the gate electrode of the thirteenth transistor N5. A drain electrode of the fourteenth transistor N6 is electrically connected to the source electrode of the fourth transistor P2 and the source electrode of the twelfth transistor N4. A source electrode of the fourteenth transistor N6 is electrically connected to the second voltage source V2. In one embodiment, the eleventh transistor N3, the twelfth transistor N4, the thirteenth transistor N5, and the fourteenth transistor N6 are NMOS transistors.

The pull-down unit 325 includes a fifteenth transistor N8. A gate electrode of the fifteenth transistor N8 is electrically connected to the output module 34 through a third node C, and is electrically connected to a drain electrode of the twelfth transistor N4. A drain electrode of the fifteenth transistor N8 is electrically connected to the second auxiliary current source 326. A source electrode of the fifteenth transistor N8 is electrically connected to the gate electrode of the thirteenth transistor N5 and the gate electrode of the fourteenth transistor N6 through a fourth node D. The source electrode of the fifteenth transistor N8 is further electrically connected to the drain electrode of the eleventh transistor N3. In one embodiment, the fifteenth transistor N8 is an NMOS transistor.

The second auxiliary current source 326 includes a sixteenth transistor P8. A gate electrode of the sixteenth transistor P8 receives the second control voltage Vbp1. A drain electrode of the sixteenth transistor P8 is electrically connected to the drain electrode of the fifteenth transistor N8. A source electrode of the sixteenth transistor P8 is electrically connected to the first voltage source V1. In one embodiment, the sixteenth transistor P8 is a PMOS transistor.

The fourth current source i-4 includes a seventeenth transistor P9 and an eighteenth transistor N9. A gate electrode of the seventeenth transistor P9 is electrically connected to third voltage source V3. A source electrode of the seventeenth transistor P9 is electrically connected to the drain electrode of the eighth transistor P6 through the first node A. A drain electrode of the seventeenth transistor P9 is electrically connected to the gate electrode of the fifteenth transistor N8 through the third node C. A gate electrode of the eighteenth transistor N9 is electrically connected to the fourth voltage source V4. A source electrode the eighteenth transistor N9 is electrically connected to the drain electrode of the twelfth transistor N4. A drain electrode of the eighteenth transistor N9 is electrically connected to the drain electrode of the eighth transistor P6 through the first node A. In one embodiment, the seventeenth transistor P9 is a PMOS transistor, and the eighteenth transistor N9 is an NMOS transistor.

The output module 34 is electrically connected to the output operational amplifier module 32. The output module 34 generates an output voltage based on the dynamic bias voltage. The output module 34 includes a first output transistor P10 and a second output transistor N10. A gate electrode of the first output transistor P10 is electrically connected to the first node A. A source electrode of the first output transistor P10 is electrically connected to the first voltage source V1. A drain electrode of the first output transistor P10 is electrically connected to an output terminal OUT. A gate electrode of the second output transistor N10 is electrically connected to the third node C. A source electrode of the second output transistor N10 is electrically connected to the second voltage source V2. A drain electrode of the second output transistor N10 is electrically connected to the output terminal OUT. In one embodiment, the first output transistor P10 is a PMOS transistor and the second output transistor N10 is an NMOS transistor.

In detail, the operational amplifier circuit 300 works as below.

When the first input voltage of the first input terminal Vi1 is a low voltage and the second input voltage of the second input terminal Vi2 is a high voltage, the first input stage circuit 311 generates the driving current to the first amplifier stage circuit 327. The first amplifier stage circuit 327 provides the dynamic bias voltage based on the driving voltage to the gate electrode of the first output transistor P10 through the first node A. The ninth transistor P7 of the pull-up unit 322 detects the voltage of the first node A. When the voltage of the first node A is less than the specified voltage which is a sum of the threshold voltages of the fourth transistor P4 and the ninth transistor P7, the ninth transistor P7 turns on. The first control voltage Vbn1 generates a current to the first node A through the first current mirror 321 for pulling up the voltage of the first node A. When the voltage of the first node A is equal to or larger than the specified voltage, the ninth transistor P7 turns off and stops providing current to the first node A.

When the first input voltage of the first input terminal Vi1 is a high voltage and the second input voltage of the second input terminal Vi2 is a low voltage, the second input stage circuit 312 generates the driving current to the second amplifier stage circuit 328. The second amplifier stage circuit 328 provides the dynamic bias voltage based on the driving voltage to the gate electrode of the second output transistor N10 through the third node C. The fifteenth transistor N8 of the pull-down unit 325 detects the voltage of the third node C. When the voltage of the third node C is larger than the specified voltage which is a sum of the threshold voltages of the thirteenth transistor N5 and the fifteenth transistor N8, the fifteenth transistor N8 turns on. The second control voltage Vbp1 generates a current to the third node C thorough the second current mirror 324 for pulling down the voltage of the third node C. When the voltage of the third node C is equal to or less than the specified voltage, the fifteenth transistor N8 turns off and stops providing current to the third node C.

Based on the structure of operational amplifier circuit 300, the dynamic bias voltage provided to the output module 34 is detectable by this disclosure. When the dynamic bias voltage is less than the specified voltage, the dynamic bias voltage is pulled up by the first control voltage, and when the dynamic bias voltage is larger than the specified voltage, the dynamic bias voltage is pulled down by the second control voltage, thus an overshot is avoided. Adjusting the current of the first control voltage or the second control voltage adjusts speed of pulling up and speed of pulling down.

While various and preferred embodiments have been described the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. An operational amplifier circuit comprising:
    a pre-operational amplifier module, configured to receive a first input voltage and a second voltage, and configured to generate a driving current based on the first input voltage and the second input voltage;
    an output operational amplifier module, configured to generate a dynamic bias voltage based on the driving current; and
    an output module, configured to generate an output voltage based on the dynamic bias voltage;
    wherein the output operational amplifier module further receives at least one control voltage; the output operational amplifier module further detects the dynamic bias voltage; when the dynamic bias voltage is less than a specified voltage, the output operational amplifier module pulls up the dynamic bias voltage based on the at least one control voltage; when the dynamic bias voltage is larger than the specified voltage, the output operational amplifier module pulls down the dynamic bias voltage based on the at least one control voltage; a pulling speed of the dynamic bias voltage is proportional to the at least one control voltage.

2. The operational amplifier circuit of claim 1, wherein the pre-operational amplifier module is a rail-to-rail input amplifier circuit; the pre-operational amplifier module comprises a first input stage circuit and a second input stage circuit; the output operational amplifier module comprises a first amplifier stage circuit and a second amplifier stage circuit; the first input stage circuit is coupled to the first amplifier stage circuit, the second input stage circuit is coupled to the second amplifier stage circuit.

3. The operational amplifier circuit of claim 2, wherein the first input stage circuit is an N-channel input stage circuit; the first input stage circuit comprises a first current source, a first transistor, and a second transistor; a gate electrode of the first transistor receives the first input voltage, a source electrode of the first transistor is electrically connected to the first current source, and a drain electrode of the first transistor is electrically connected to the first amplifier stage circuit; a gate electrode of the second transistor receives the second input voltage, a source electrode of the second transistor is electrically connected to the first current source, and a drain electrode of the second transistor is electrically connected to the first amplifier stage circuit.

4. The operational amplifier circuit of claim 2, wherein the second input stage is a P-channel input stage circuit; the second input stage circuit comprises a second current source, a third transistor, and a fourth transistor; a gate electrode of the third transistor receives the first input voltage, a source electrode of the third transistor is electrically connected to the second current source, and a drain electrode of the third transistor is electrically connected to the second amplifier stage circuit; a gate electrode of the fourth transistor receives the second input voltage, a source electrode of the fourth transistor is electrically connected to the second current source, and a drain electrode of the fourth transistor is electrically connected to the second amplifier stage circuit.

5. The operational amplifier circuit of claim 2, wherein the first amplifier stage circuit comprises a first current mirror, a pull-up unit, and a first auxiliary current source; the first current mirror outputs the dynamic bias voltage to the output module based on the driving current; the pull-up unit detects that whether the dynamic bias voltage is less than the specified voltage; when the dynamic bias voltage is less than the specified voltage, the pull-up unit provides a current of the first auxiliary current source based on a first control voltage to the output module, for pulling up the dynamic bias voltage; the second amplifier stage circuit comprises a second current mirror, a pull-down unit, and a second auxiliary current source; the second current mirror outputs the dynamic bias voltage to the output module based on the driving current; the pull-down unit detects that whether the dynamic bias voltage is larger than the specified voltage; when the dynamic bias voltage is larger than the specified voltage, the pull-down unit provides a current of the second auxiliary current source based on a second control voltage to the output module, for pulling down the dynamic bias voltage.

6. The operational amplifier circuit of claim 5, wherein the pull-up unit comprises a ninth transistor; a gate electrode of the ninth transistor is electrically connected to the output module through a first node, and is electrically connected to the first current mirror; a drain electrode of the ninth transistor is electrically connected to the first auxiliary current source; a source electrode of the ninth transistor is electrically connected to the first current mirror through a second node; the first auxiliary current source comprises a tenth transistor; a gate electrode of the tenth transistor receives the first control voltage; a drain electrode of the tenth transistor is electrically connected to the drain electrode of the ninth transistor; a source electrode of the tenth transistor is grounded.

7. The operational amplifier circuit of claim 6, wherein the pull-down unit comprises a fifteenth transistor; a gate electrode of the fifteenth transistor is electrically connected to the output module through a third node, and is electrically connected to the second current mirror; a drain electrode of the fifteenth transistor is electrically connected to the second auxiliary current source; a source electrode of the fifteenth transistor is electrically connected to the second current mirror through a fourth node; the second auxiliary current source comprises a sixteenth transistor; a gate electrode of the sixteenth transistor receives the second control voltage; a drain electrode of the sixteenth transistor is electrically connected to the drain electrode of the fifteenth transistor; a source electrode of the sixteenth transistor is electrically connected to the first voltage source.

8. The operational amplifier circuit of claim 7, wherein a third current source is electrically connected to the second node and the fourth node; a fourth current source is electrically connected to the first node and the third node.

9. The operational amplifier circuit of claim 1, wherein the specified voltage is a sum of the threshold voltages of at least two transistors.

10. The display apparatus of claim 1, wherein the specified voltage is a sum of the threshold voltages of at least two transistors.

11. A display apparatus comprising:
a plurality of scan lines;
a plurality of data lines configured to cooperate with the plurality of scan lines to define a plurality of pixel units at cross-points; and
a data driver disposed in a non-display region, and electrically connected to the plurality of data lines; the data driver comprising an operational amplifier circuit;
the operational amplifier circuit comprising:
a pre-operational amplifier module, configured to receive a first input voltage and a second voltage, and configured to generate a driving current based on the first input voltage and the second input voltage;
an output operational amplifier module, configured to generate a dynamic bias voltage based on the driving current; and
an output module, configured to generate an output voltage based on the dynamic bias voltage;
wherein the output operational amplifier module further receives at least one control voltage; the output operational amplifier module further detects the dynamic bias voltage; when the dynamic bias voltage is less than a specified voltage, the output operational amplifier module pulls up the dynamic bias voltage based on the at least one control voltage; when the dynamic bias voltage is larger than the specified voltage, the output operational amplifier module pulls down the dynamic bias voltage based on the at least one control voltage; a pulling speed of the dynamic bias voltage is proportional to the at least one control voltage.

12. The display apparatus of claim 11, wherein the pre-operational amplifier module is a rail-to-rail input amplifier circuit; the pre-operational amplifier module comprises a first input stage circuit and a second input stage circuit; the output operational amplifier module comprises a first amplifier stage circuit and a second amplifier stage circuit; the first input stage circuit is coupled to the first amplifier stage circuit, the second input stage circuit is coupled to the second amplifier stage circuit.

13. The display apparatus of claim 12, wherein the second input stage is a P-channel input stage circuit; the second input stage circuit comprises a second current source, a third transistor, and a fourth transistor; a gate electrode of the third transistor receives the first input voltage, a source electrode of the third transistor is electrically connected to the second current source, and a drain electrode of the third transistor is electrically connected to the second amplifier stage circuit; a gate electrode of the fourth transistor receives the second input voltage, a source electrode of the fourth transistor is electrically connected to the second current source, and a drain electrode of the fourth transistor is electrically connected to the second amplifier stage circuit.

14. The display apparatus of claim 12, wherein the first amplifier stage circuit comprises a first current mirror, a pull-up unit, and a first auxiliary current source; the first current mirror outputs the dynamic bias voltage to the output module based on the driving current; the pull-up unit detects that whether the dynamic bias voltage is less than the specified voltage; when the dynamic bias voltage is less than the specified voltage, the pull-up unit provides a current of the first auxiliary current source based on a first control voltage to the output module, for pulling up the dynamic bias voltage; the second amplifier stage circuit comprises a second current mirror, a pull-down unit, and a second auxiliary current source; the second current mirror outputs the dynamic bias voltage to the output module based on the driving current; the pull-down unit detects that whether the dynamic bias voltage is larger than the specified voltage; when the dynamic bias voltage is larger than the specified voltage, the pull-down unit provides a current of the second auxiliary current source based on a second control voltage to the output module, for pulling down the dynamic bias voltage.

15. The display apparatus of claim 14, wherein the pull-up unit comprises a ninth transistor; a gate electrode of the ninth transistor is electrically connected to the output module through a first node, and is electrically connected to the first current mirror; a drain electrode of the ninth transistor is electrically connected to the first auxiliary current source; a source electrode of the ninth transistor is electrically connected to the first current mirror through a second node; the first auxiliary current source comprises a tenth transistor; a gate electrode of the tenth transistor receives the first control voltage; a drain electrode of the tenth transistor is electrically connected to the drain electrode of the ninth transistor; a source electrode of the tenth transistor is grounded.

16. The display apparatus of claim 15, wherein the pull-down unit comprises a fifteenth transistor; a gate electrode of the fifteenth transistor is electrically connected to the output module through a third node, and is electrically connected to the second current mirror; a drain electrode of the fifteenth transistor is electrically connected to the second auxiliary current source; a source electrode of the fifteenth transistor is electrically connected to the second current mirror through a fourth node; the second auxiliary current source comprises a sixteenth transistor; a gate electrode of the sixteenth transistor receives the second control voltage; a drain electrode of the sixteenth transistor is electrically connected to the drain electrode of the fifteenth transistor; a source electrode of the sixteenth transistor is electrically connected to the first voltage source.

17. The display apparatus of claim 16, wherein a third current source is electrically connected to the second node and the fourth node; a fourth current source is electrically connected to the first node and the third node.

18. The display apparatus of claim 11, wherein the first input stage circuit is an N-channel input stage circuit; the first input stage circuit comprises a first current source, a first transistor, and a second transistor; a gate electrode of the first transistor receives the first input voltage, a source electrode of the first transistor is electrically connected to the first current source, and a drain electrode of the first transistor is electrically connected the first amplifier stage circuit; a gate electrode of the second transistor receives the second input voltage, a source electrode of the second transistor is electrically connected to the first current source, and a drain electrode of the second transistor is electrically connected to the first amplifier stage circuit.

* * * * *